United States Patent [19]

Murden et al.

[11] Patent Number: 5,757,220

[45] Date of Patent: May 26, 1998

[54] DIGITALLY CONTROLLED PROGRAMMABLE ATTENUATOR

[75] Inventors: Franklin M. Murden; Carl W. Moreland, both of Greensboro, N.C.

[73] Assignee: Analog Devices, Inc., Norwood, Mass.

[21] Appl. No.: 772,359

[22] Filed: Dec. 23, 1996

[51] Int. Cl.$^6$ .................................................. H03G 3/00
[52] U.S. Cl. .......................... 327/308; 327/306; 327/530; 333/81 R
[58] Field of Search .............................. 327/306, 530, 327/308; 333/81 R

[56] References Cited

U.S. PATENT DOCUMENTS

| | | | |
|---|---|---|---|
| 4,851,842 | 7/1989 | Iwamatsu | 341/139 |
| 5,006,735 | 4/1991 | Taylor | 327/308 |
| 5,007,541 | 4/1991 | Gilbert | 330/284 |

*Primary Examiner*—Timothy P. Callahan
*Assistant Examiner*—Dinh Le
*Attorney, Agent, or Firm*—Koppel & Jacobs

[57] ABSTRACT

A digitally controlled programmable attenuator maintains tight phase matching between attenuated signals over wide ranges of frequencies and power levels regardless of the selected attenuation level. This is achieved with a multi-tap ladder network that sets a desired tap-to-tap dB step-size, a plurality of unity gain digitally switched voltage-to-voltage buffers that are connected between the respective taps and a common output, and a fixed gain stage that sets the attenuator's overall gain/attenuation. The buffers maintain a high and substantially constant impedance whether turned on or turned off. Phase matching within 0.2° at frequencies up to 300 MHz for 30 dB of gain variation has been realized. The buffers can be implemented with complementary bipolar or BiCMOS processes

9 Claims, 3 Drawing Sheets

DIGITALLY CONTROLLED PROGRAMMABLE ATTENUATOR

BACKGROUND OF THE INVENTION

1. Field of the Invention

This invention relates to attenuation circuitry and more specifically to a digitally controlled attenuator that maintains tight phase matching over a wide range of frequencies and power levels.

2. Description of the Related Art

Attenuation circuits provide a plurality of discrete attenuation levels that are individually selected to control the gain of an analog signal in analog-to-digital converters (ADCs) or audio circuitry. In an ADC, the attenuation circuit is used to match the amplitude range of an analog signal to the input range of an analog-to-digital converter (ADC) to maximize resolution without clipping. Known attenuation circuits have limited switching and bandwidth capabilities and provide only loose phase matching over frequency and power levels. Any change in phase appears as distortion in a phase or frequency modulated system. As a result, the frequency and power ranges of the analog signal are limited and intensive equalization is required to process the attenuated signals.

Two different types of attenuation circuits are described in conjunction with an ADC. One well known approach is to pass the analog signal through multiple channels in which each channel has a different gain/attenuation buffer and its own fixed-range "flash" ADC. A DSP looks at the digital signal coming out of the highest gain channel. If the digital signal is saturated, the DSP steps down to the next highest gain channel and so forth until it identifies an unsaturated signal. This causes a time delay of several clock cycles before the proper gain/attenuation level is attained, during which the digital signal is saturated and information may be lost. Furthermore, the signals gain paths cannot be changed during the transmission of a data burst because the equalization would be severely compromised due to phase and gain differences between gain paths. As a result, the receiver is very hardware intensive.

Iwamatsu, U.S. Pat. No. 4,851,842, discloses an ADC that detects the level of an analog signal and uses the detected level to adjust the gain of an attenuation circuit. As shown in FIG. 3 and described in col. 4, lines 5–18, the attenuation circuit includes a unity gain amplifier that is connected in parallel with a switchable resistor network. The level detection circuit switches selected resistors in the network into the feedback loop around the amplifier to set its gain. As a result, the bandwidth and phase of the resulting digital signal may be a function of the selected gain level. Thus, as before, equalization may be compromised.

SUMMARY OF THE INVENTION

In view of the above problems, the present invention provides a digitally controlled programmable attenuator that maintains tight phase matching between attenuated signals over wide ranges of frequencies and power levels regardless of the selected attenuation level.

This is achieved with a multi-tap ladder network that sets a desired tap-to-tap dB step-size, a plurality of unity gain digitally switched voltage-to-voltage buffers that are connected between the respective taps and a common output, and a fixed gain stage that sets the attenuator's overall gain/attenuation. The buffers maintain a high and substantially constant impedance whether turned on or turned off. Phase matching within 0.2° at frequencies up to 300 MHz for 30 dB of gain variation has been realized. The buffers can be implemented with complementary bipolar or BiCMOS processes.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a digitally controlled programmable attenuator, which maintains tight phase matching between attenuated signals over wide range of frequencies and power levels regardless of the selected attenuation level. This is achieved by using unity gain buffers whose input impedance is approximately constant, whether turned on or off. Phase matching within 0.2° at frequencies up to 300 MHz for 30 dB of gain variation has been realized. Another feature of the programmable attenuator is that each buffer's bias current can be throttled back when its turned off. This reduces the power consumption of the programmable attenuator. Although the buffers are currently implemented with a complementary bipolar fabrication process to provide the speed necessary to operate at IF frequencies or higher, other fabrication processes such as BiCMOS may be used to realize the architecture shown in FIG. 1.

Figure 1:
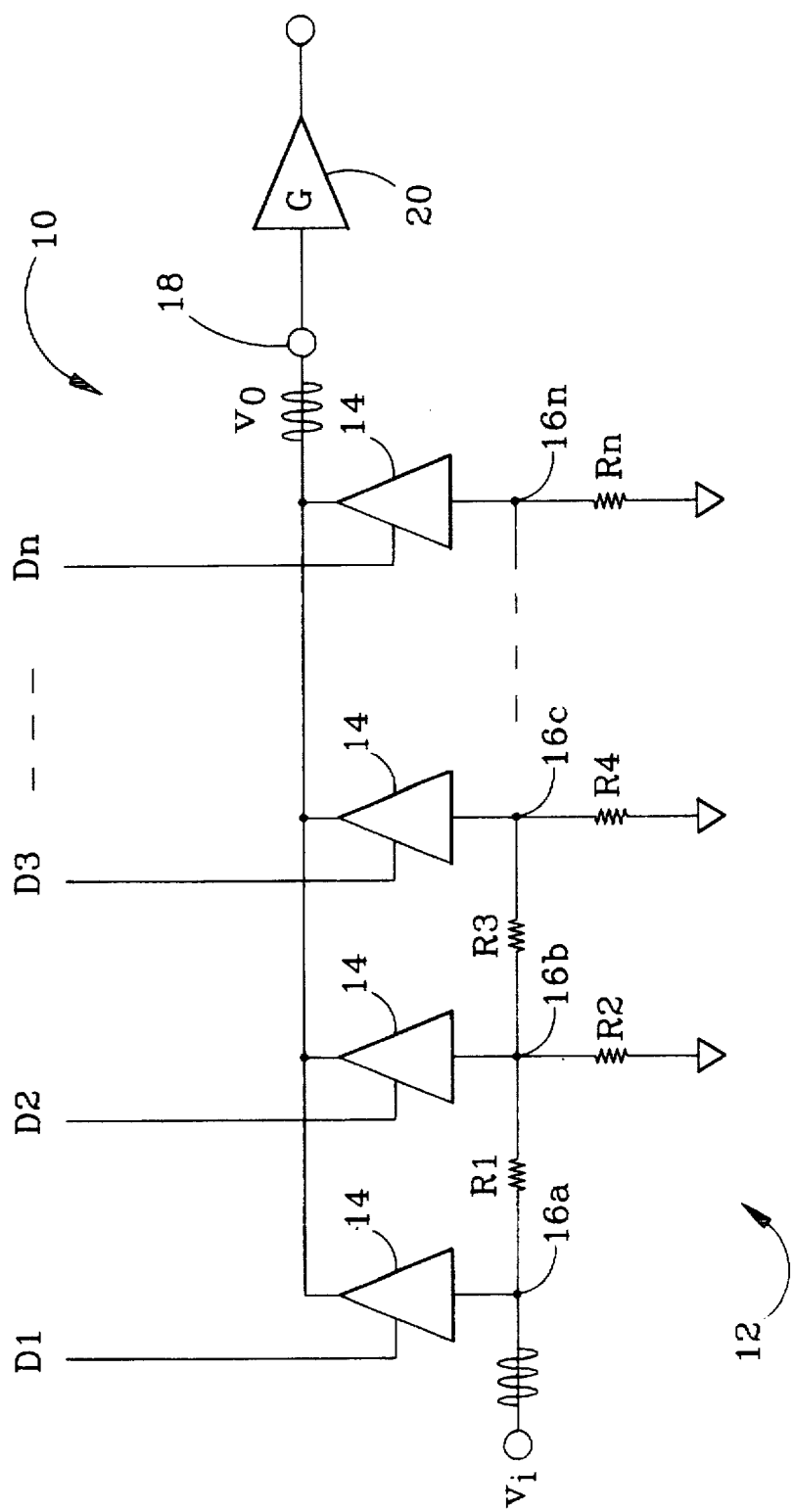
FIG. 1 is a schematic block diagram of a digitally controlled programmable attenuator in accordance with the present invention.

As shown in FIG. 1, a digitally controlled programmable attenuator 10 includes a multi-tap ladder network 12 that sets a desired tap-to-tap dB step-size, a plurality of unity gain digitally switched voltage-to-voltage buffers 14 that are connected between the respective taps 16a, 16b, ... 16n and a common output 18, and a fixed gain stage 20 that sets the attenuator's overall gain/attenuation. A standard R-2R ladder configuration with six buffers per side, in which the odd numbered resistors have resistance R and the even numbered resistors have resistance 2R, can be used to set a −6 dB tap-to-tap drop and attenuation levels of 0, −6, −12, −18, −24 and −30 dB. Different ladder configurations can be designed to set other tap-to-tap drops. A fixed gain stage 20 of 18 dB provides an overall gain range of −12, −6, 0, 6, +12 dB.

An analog voltage signal $v_{in}$ is applied to the top tap 16a of the multi-tap ladder network 12 so that the signal level at tap 16b is attenuated by 6 dB, the signal level at tap 16c is attenuated by 12 dB and so forth until the signal at tap 16n is attenuated by 30 dB. The buffers 14 have digital inputs D1,D2, . . ., Dn that respond to respective binary voltage signals to turn them on and off. In general, only one buffer is turned on at a time so that the attenuated voltage signal at its tap is switched through to the common output 18 while the other buffers are held off. If the attenuation circuit 10 is idle, all of the buffers can be turned off to conserve power. The input impedance of the buffer remains high, whether on or off, so that it does not interact with the resistance of the ladder or the impedance of the signal source, which would corrupt the phase of the signal. The voltage signal $v_o$ at the common output 18 is then amplified by the fixed gain stage 20.

Figure 2:
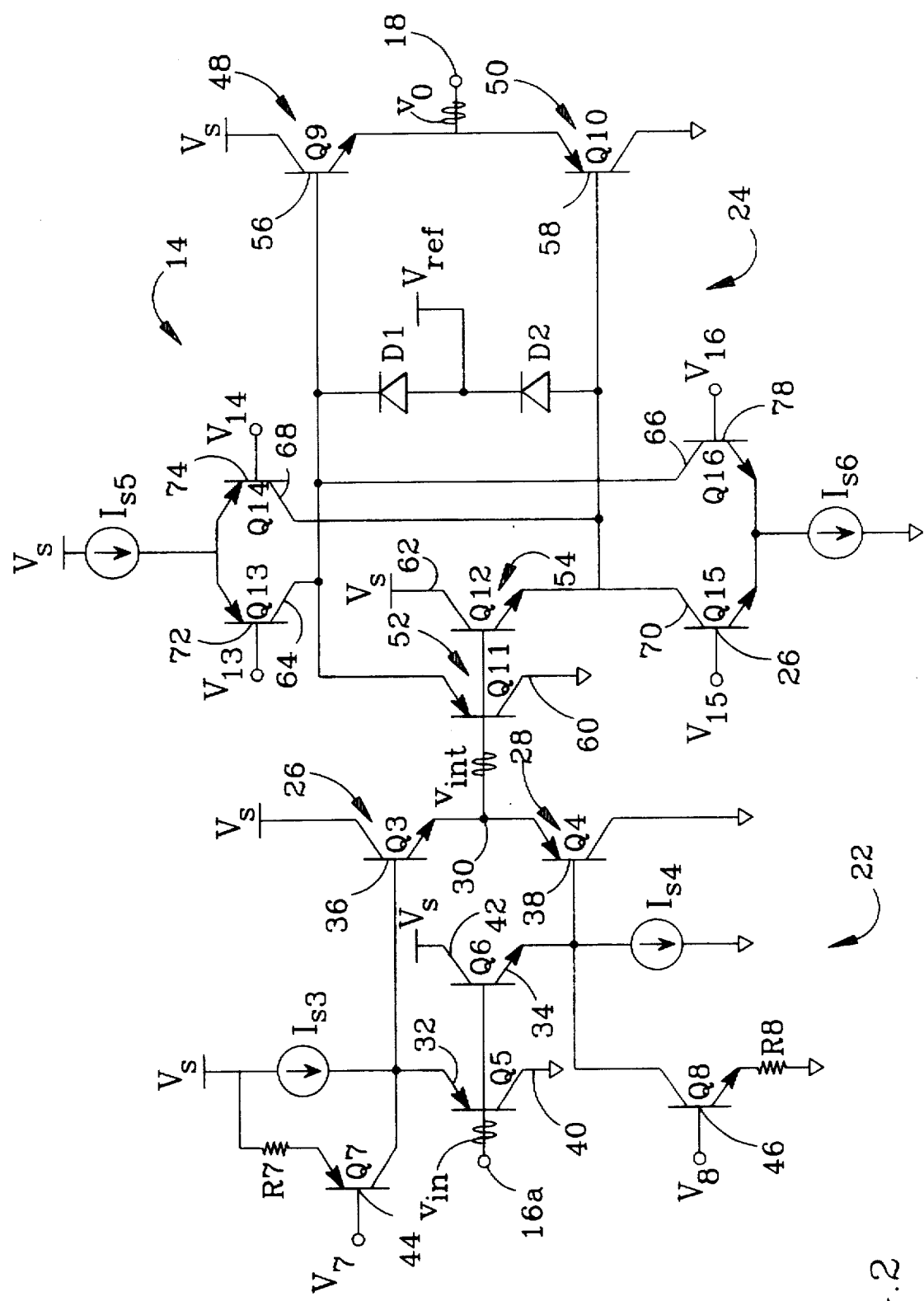
FIG. 2 is a schematic diagram of a complementary bipolar implementation of the buffer shown in FIG. 1.

As shown in FIG. 2, a complementary bipolar implementation of the unity gain buffer 14 includes an input stage 22 that remains on to buffer the voltage signal $v_{in}$ through to an output stage 24 with unity gain and presents an approximately constant input impedance at its tap 16a to maintain phase matching between the different attenuation levels. The output stage 24 is switched on and off in response to the binary code Dn to selectively switch the attenuated signal voltage $v_{in}$ through to the common output 18.

The input stage 22 includes a class AB push-pull unity gain buffer that is modified to throttle back the bias current when the buffer 14 is off. The push-pull buffer includes a pair of npn and pnp emitter-follower output transistors Q3 and Q4 whose collector-emitter circuits 26 and 28 are connected in series at node 30 between the positive supply voltage $V_s$ and ground reference potential. The output transistors Q3 and Q4 deliver power on alternate half-cycles of the voltage signal V to produce a voltage signal $v_{int}$ at node 30 that tracks $v_{in}$.

The base-emitter junctions 32 and 34 of pnp and npn bias transistors Q5 and Q6 are connected between tap 16a and the bases 36 and 38 of output transistors Q3 and Q4, respectively. Transistor Q5's and Q6's collectors 40 and 42 are connected to ground and the positive supply respectively. This shifts the voltage at the base 36 of Q3 up and the voltage at the base 38 of Q4 down by a base-emitter voltage with respect to the voltage signal $v_{in}$ thereby substantially eliminating crossover distortion in the voltage signal $v_{int}$ so that it accurately follows the voltage signal $v_{in}$ with unity gain.

Neglecting base currents, the bias current for transistor Q5 is supplied by the parallel combination of a constant current source $I_{S3}$ and a pnp transistor Q7 with a collector resistor R7. Similarly, the bias current for transistor Q6 is supplied by the parallel combination of a constant current source $I_{S4}$ and an npn transistor Q8 with a collector resistor R8. When the buffer 14 is on (D1=1), the digital voltage signals $V_7$ and $V_8$ at the bases 44 and 46 of transistors Q7 and Q8 are switched low and high, respectively, so that both transistors are forward biased and supply bias current. The total bias current for Q5 and Q6 is suitably 0.25 ma to 0.5 ma with approximately one-half of that being supplied by transistors Q7 and Q8.

When the buffer 14 is off (D1=0), transistors Q7 and Q8 are reverse biased, and thus do not supply current. This throttles the bias current through transistors Q5 and Q6 back by about one-half, which reduces power consumption. Although the reduced bias current is not sufficient to sustain the performance of the input stage were the buffer on, it is sufficiently large that transistors Q5 and Q6 remain on. As a result, the buffer's input impedance, which is primarily composed of the parasitic collector-base capacitance of transistor Q5, is insensitive to the changes in bias current. If the bias current were throttled back to the point that transistors Q5 and Q6 were turned off, the input impedance would change and induce a phase mismatch between different attenuated signals.

The output stage 24 includes a class AB push-pull unity gain buffer and a digitally controlled switching circuit that turns the unity gain buffer on and off in response to binary signal D1. The unity gain buffer includes a pair of npn and pnp emitter-follower output transistors Q9 and Q10 whose collector-emitter circuits 48 and 50 are connected in series between the positive supply voltage $V_s$ and ground reference potential to produce a voltage signal $v_o$ at the common output 18 that follows the voltage signal $v_{int}$ and hence voltage signal $v_{in}$. The base-emitter junctions 52 and 54 of pnp and npn bias transistors Q11 and Q12 are connected between node 30 and the bases 56 and 58 of output transistors Q9 and Q10, respectively. Transistor Q11's and Q12's collectors 60 and 62 are connected to ground and the positive supply respectively. This shifts the voltage at the base 56 of Q9 up and the voltage at the base 58 of Q10 down by a base-emitter voltage with respect to the voltage signal $v_{int}$.

The switching circuit includes a pair of emitter-coupled pnp transistors Q13 and Q14 and a pair of emitter-coupled npn transistors Q15 and Q16. The collectors 64 and 66 of transistors Q13 and Q16, respectively, are connected to the emitter of transistor Q11. The collectors 68 and 70 of transistors Q14 and Q15, respectively, are connected to the emitter of transistor Q12. Current sources $I_{S5}$ and $I_{S6}$ supply the bias current to the respective pnp and npn transistor pairs. A pair of diodes D1 and D2 are connected in series between the bases of output transistors Q9 and Q10 with the voltage at the series connection of the diodes being held at a reference voltage $V_{ref}$ of approximately 2.4 V. Binary control voltage signals $V_{13}$, $V_{14}$, $V_{15}$ and $V_{16}$ are applied to the bases 72, 74, 76 and 78 of transistors Q13, Q14, Q15 and Q16, respectively, and switch in accordance with the value of D1.

When control voltage signals $V_{13}$ and $V_{16}$ are low and $V_{14}$ and $V_{15}$ are high (D1=1), the bias current flows through bias transistors Q11 and Q12, which turns the output transistors Q9 and Q10 on and turns the diodes D1 and D2 off. As a result, the voltage signal $v_o$ is switched through to the output 18. When control voltage signals $V_{13}$ and $V_{16}$ are high and $V_{14}$ and $V_{15}$ are low (D1=0), the bias current bypasses transistors Q11 and Q12, which turns the output transistors Q9 and Q10 off. Turning transistors Q14 and Q16 on, pulls the voltage at the base 56 of Q9 down and pulls the voltage at the base 58 of Q10 up thereby turning diodes D1 and D2 on. This prevents the voltage signal $v_{int}$ from bleeding through to the common output 18.

Figure 3:
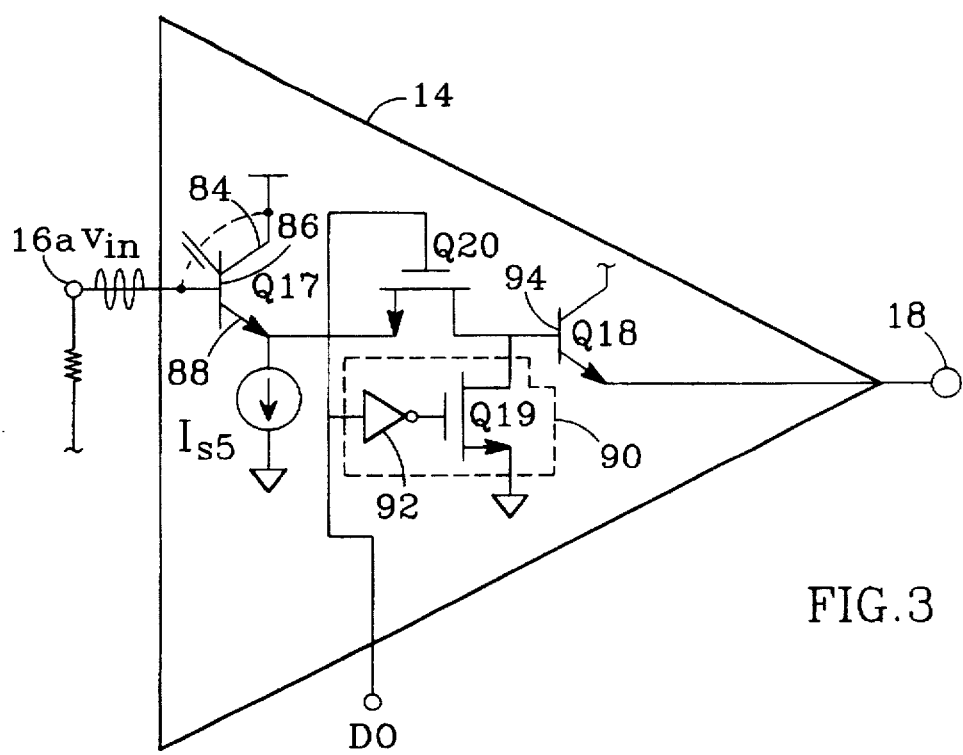
FIG. 3 is a schematic diagram of a BiCMOS implementation of the buffer shown in FIG. 1.

As shown in FIG. 3, a BiCMOS implementation of the unity gain buffer 14 includes an input stage 80 that remains on to buffer the voltage signal $v_{in}$ through to an output stage 82 with unity gain and presents an approximately constant input impedance at its tap 16a to maintain phase matching between the different attenuation levels. The output stage 82 is switched on and off in response to the binary code Dn to selectively switch the attenuated signal voltage $v_{in}$ through to the common output 18.

The input stage 80 includes an npn bipolar transistor Q17 having a collector 84 that is tied to the supply voltage, a base 86 that is connected to the buffer's tap 16a, and an emitter 88 that is connected to a current source $I_{S5}$ this configuration, the transistor Q17 is always on such that the attenuated voltage $v_{in}$ is shifted down a base-emitter voltage with approximately unity gain at emitter 88. The impedance seen looking into the buffer is primarily composed of transistor Q17's parasitic collector-base capacitance, which is high and remains constant.

The output stage 82 includes an output transistor Q18 for buffering the shifted attenuated voltage $v_{in}$ through to the common output 18. An external current source (not shown) supplies current to the output transistor Q18 in the one buffer that is turned on. A MOS switch 90 includes an inverter 92 and an NMOS transistor Q19 that turn transistor Q18 on and off in response to the digital control signal D0. A CMOS switch Q20 switches in opposition to transistor Q19 such that the shifted voltage $v_i$ at the emitter 88 of Q17 is only applied to the base 94 of transistor Q18 when the buffer is turned on. Specifically, when the control signal is low, transistor Q18 turns on, which pulls the base 94 of transistor Q17 to ground. Conversely, when the control signal is high, CMOS transistor Q20 is turned on such that the shifted voltage is applied to the base 94 of Q17.

Figure 4:
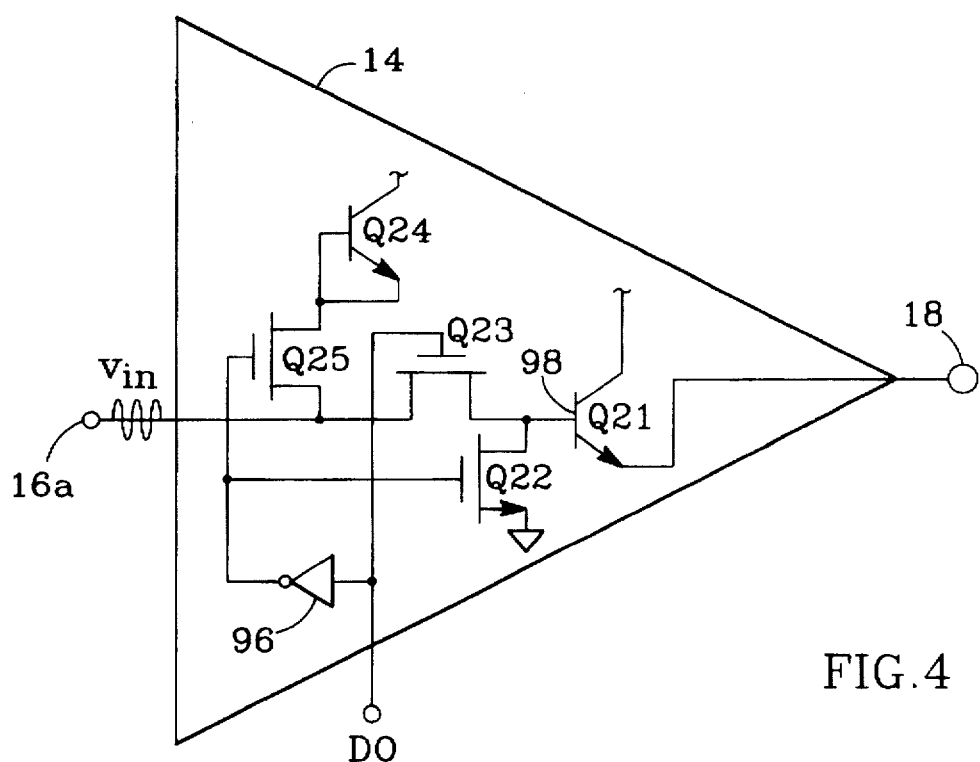
FIG. 4 is a schematic diagram of another BiCMOS implementation of the buffer shown in FIG. 1

As shown in FIG. 4, a different BiCMOS implementation of the unity gain buffer 14 includes a bipolar transistor Q21 that when turned on buffers the attenuated voltage signal $v_{in}$ through to the common output 18. CMOS switches Q22 and Q23 switch in opposition to turn bipolar transistor Q21 on and off in response to D0. When D0 is low, an inverter 96 turns Q22 on, which pulls the base 98 of transistor Q21 to ground. When D0 is high, Q23 turns on such that the voltage signal $v_{in}$ is applied to Q21's base 98 and buffered through to the common output 18. When Q21 is turned on, the impedance seen at tap 16a is primarily its collector-base capacitance, which is very high and insensitive to small changes in bias current.

When Q21 is turned off, its collector-base capacitance is not seen. Therefore, another bipolar transistor Q24 is connected such that its collector-base capacitance is seen when Q21 is off. Specifically a CMOS switch Q25 is connected between tap 16a and the base-emitter junction of transistor Q23 and is controlled by the output of inverter 96. When D0 is low, CMOS switch Q25 turns on so that Q24's collector-base capacitance is seen at tap 16a. When D0 is high, CMOS switch Q25 turns off so that Q21's collector-base capacitance is seen. To maintain phase integrity in this topology, the transistors must be very high $f_T$ devices so that the load at the emitter of Q21 as reflected back to tap 16a is negligible when Q21 is turned on.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A digitally controlled programmable attenuator, comprising:
    a multi-tap resistive ladder network that attenuates an analog voltage signal to establish a plurality of voltage signals at its taps having different attenuation levels;
    a plurality of voltage-to-voltage buffers that are connected between the respective taps and a common output, said buffers having respective digital inputs for receiving a digital signal that turns on one of said buffers so that the voltage signal at its tap is switched through to the common output while the other buffers are held off, each said buffer presenting a substantially constant impedance, whether on or off, at its tap so that the voltage signals switched through said buffers to said common output are approximately phase matched; and
    a fixed gain stage that amplifies the voltage signal at the common output by a fixed gain level to set the attenuator's overall gain range.

2. The digitally controlled programmable attenuator of claim 1, wherein each buffer comprises:
    an input stage that is always on such that it presents an approximately constant impedance at its tap so that a total impedance of the programmable attenuator, and thus a phase of the voltage signal switched through to the common output is approximately constant regardless of which buffer is switched on; and
    an output stage that turns on and off in response to the digital signal at said digital input to selectively switch the voltage signal at the buffer's tap through to the common output.

3. The digitally controlled programmable attenuator of claim 2, wherein said input stage conducts a bias current and comprises:
    a current regulation circuit that reduces the bias current to reduce power consumption when the buffer is off.

4. A digitally controlled programmable attenuator, comprising:
    a multi-tap resistive ladder network that attenuates an analog voltage signal to establish a plurality of voltage signals at its taps having different attenuation levels;
    a plurality of buffers that are connected between the respective taps and a common output, said buffers having respective digital inputs for receiving a digital signal that turns on one of said buffers so that the voltage signal at its tap is switched through to the common output while the other buffers are held off, said buffers presenting a substantially constant impedance at their respective taps so that the voltage signals switched through said buffers to said common output are approximately phase matched, each said buffer comprising,
        an input stage that is always on such that it presents an approximately constant impedance at its tap so that a total impedance of the programmable attenuator, and thus a phase of the voltage signal switched through to the common output is approximately constant regardless of which buffer is switched on, and
        an output stage that turns on and off in response to the digital signal at said digital input to selectively switch the voltage signal at the buffer's tap through to the common output, said input and output stages each comprise a complementary bipolar class A-B push-pull stage and said output stage further comprises a switching circuit for turning its push-pull stage on and off in response to the digital signal; and
    a fixed gain stage that amplifies the voltage signal at the common output by a fixed gain level to set the attenuator's overall gain range.

5. The digitally controlled programmable attenuator of claim 4, wherein said input stage's push-pull stage conducts a bias current, said input stage further comprising a current regulation circuit that reduces the bias current when the buffer is turned off to a level that is sufficiently large to keep the push-pull stage on and maintain the constant impedance but would not be sufficient to sustain the performance of the stage were the buffer turned on.

6. A digitally controlled programmable attenuator, comprising:
    a multi-tap resistive ladder network that attenuates an analog voltage signal to establish a plurality of voltage signals at its taps having different attenuation levels;
    a plurality of buffers that are connected between the respective taps and a common output, said buffers having respective digital inputs for receiving a digital signal that turns on one of said buffers so that the voltage signal at its tap is switched through to the common output while the other buffers are held off, said buffers presenting a substantially constant impedance at their respective taps so that the voltage signals switched through said buffers to said common output are approximately phase matched, each said buffer comprising, an input stage having an input bipolar emitter-follower that is biased such that it is always on and buffers the voltage signal at its tap through to an internal node said input stage presenting an approximately constant impedance at its tap so that a total impedance of the programmable attenuator, and thus a phase of the voltage signal switched through to the common output is approximately constant regardless of which buffer is switched on, and an output stage that turns on and off in response to the digital signal at said digital input to selectively switch the voltage signal at the buffer's tap through to the common output, said output stage comprising, an output bipolar emitter-follower that selectively buffers the voltage signal at said internal node through to the common output, a control switch that turns said output bipolar emitter-follower on and off in response to said digital signal, and a CMOS switch that switches in opposition to said control switch to apply the voltage signal at said internal node to said output bipolar emitter-follower when it is turned on; and a fixed gain stage that amplifies the voltage signal at the common output by a fixed gain level to set the attenuator's overall gain range.

7. A digitally controlled programmable attenuator, comprising:

a multi-tap resistive ladder network that attenuates an analog voltage signal to establish a plurality of voltage signals at its taps having different attenuation levels;

a plurality of buffers that are connected between the respective taps and a common output, said buffers having respective digital inputs for receiving a digital signal that turns on one of said buffers so that the voltage signal at its tap is switched through to the common output while the other buffers are held off, said buffers presenting a substantially constant impedance at their respective taps so that the voltage signals switched through said buffers to said common output are approximately phase matched, each said buffer comprising a bipolar emitter-follower that selectively buffers the voltage signal at said tap through to said common output, said emitter-follower's collector-base capacitance providing the buffer's constant impedance seen at said tap when said emitter-follower is turned on;

a control switch that turns said bipolar emitter-follower on and off in response to said digital signal;

a first CMOS switch that switches in opposition to said control switch to apply the voltage signal at said tap to said bipolar emitter-follower when it is turned on;

a bipolar load transistor having a common base-emitter connection; and a second CMOS switch that switches in opposition to said first CMOS switch so that when said emitter-follower is turned off the load transistor's collector-base capacitance is seen at said tap to maintain the buffer's constant impedance; and a fixed gain stage that amplifies the voltage signal at the common output by a fixed gain level to set the attenuator's overall gain range.

8. A digitally controlled programmable attenuator, comprising:

a multi-tap resistive ladder network that attenuates an analog voltage signal to establish a plurality of voltage signals at its taps having different attenuation levels;

a plurality of voltage-to-voltage buffers that are connected between the respective taps and a common output, said buffers having respective digital inputs for receiving a digital signal that turns on one of said buffers so that the voltage signal at its tap is switched through to the common output while the other buffers are held off, each said buffer comprising, wherein each buffer comprising an input stage that is always on such that it presents an approximately constant impedance at its tap, whether the buffer is on or off, so that a total impedance of the programmable attenuator, and thus a phase of the voltage signal switched through to the common output is approximately constant regardless of which buffer is switched on, and an output stage that turns on and off in response to a digital signal at said digital input to selectively switch the voltage signal at the buffer's tap through to the common output; and a fixed gain stage that amplifies the voltage signal at the common output by a fixed gain level to set the attenuator's overall gain range.

9. The digitally controlled programmable attenuator of claim 8, wherein said input stage conducts a bias current and comprises:

a current regulation circuit that reduces the bias current to reduce power consumption when the buffer is off.

* * * * *